United States Patent [19]

Nakagawa et al.

[11] Patent Number: 4,845,355
[45] Date of Patent: Jul. 4, 1989

[54] PHOTOCONDUCTIVE TYPE SENSOR AND ITS DRIVING METHOD AND APPARATUS

[75] Inventors: Katsumi Nakagawa, Kawasaki; Soichiro Kawakami, Sagamihara; Ihachiro Gofuku, Hiratsuka; Katsunori Hatanaka, Yokohama; Masaki Fukaya, Isehara; Toshiyuki Komatsu, Yamato, all of Japan

[73] Assignee: Canon Kabushiki Kaisha, Tokyo, Japan

[21] Appl. No.: 169,133

[22] Filed: Mar. 10, 1988

Related U.S. Application Data

[63] Continuation of Ser. No. 943,757, Dec. 19, 1986, abandoned.

[30] Foreign Application Priority Data

Dec. 20, 1985 [JP] Japan .................. 60-288180

[51] Int. Cl.$^4$ ............................................. H01J 40/14
[52] U.S. Cl. .................................. 250/211 J; 357/30
[58] Field of Search ................. 250/211 R, 211 J; 357/30 D, 30 I, 30 J, 30 K, 30 R, 30 Q

[56] References Cited

U.S. PATENT DOCUMENTS

| | | | |
|---|---|---|---|
| 3,813,539 | 5/1974 | Sioma | 250/214 R |
| 4,427,990 | 1/1984 | Nishizawa | 357/30 I |
| 4,549,088 | 10/1985 | Ozawa | 357/30 I |
| 4,604,638 | 8/1986 | Matsuda | 357/30 I |
| 4,685,195 | 8/1987 | Szydlo et al. | 357/30 I |

*Primary Examiner*—David C. Nelms
*Assistant Examiner*—Khaled Shami
*Attorney, Agent, or Firm*—Fitzpatrick, Cella, Harper & Scinto

[57] ABSTRACT

A photoconductive type sensor which comprises a photoconductive layer having a photosensing region. A pair of main electrodes are provided which are disposed on the photosensing region of the photoconductive layer. The sensor also comprises a gate electrode for applying a bias voltage to the photosensing region. The gate electrode provides a bias of one polarity so as to suppress the generation of a channel in the photosensing region.

3 Claims, 9 Drawing Sheets

PHOTOCONDUCTIVE TYPE SENSOR AND ITS DRIVING METHOD AND APPARATUS

This is a continuation of application Ser. No. 943,757, filed Dec. 19, 1986, now abandoned.

BACKGROUND OF THE INVENTION

1. Field of the Invention

The present invention relates to a photoconductive type sensor and its driving and, more particularly, to a photoconductive type sensor and its driving method and apparatus in which the signal current is large and the response speed to light is improved.

A photoconductive type sensor and its driving method and apparatus according to the invention are applied to, for example, the image input section and the like of a facsimile, digital copier, image reader, or the like.

2. Related Background Art

Recently, in association with the spread of what are called electronic office machines such as facsimile machines, digital copiers, and the like, the demand for a small-sized and low-cost image input apparatus grows more and more. For this purpose, attention has been directed to the line sensor of the equal magnification type which can be directly brought into contact with an original and in which the image forming system is unnecessary or the operation distance of the image forming system is short.

Since the equal magnification type line sensor needs to have a length which is equal to the length of one side of the actual original, it is necessary to densely arrange a number of sensors in order to obtain high resolution. To attain this object, it is suitable to use a thin film semiconductor such as CdS.Se, or amorphous silicon hydrided (hereinafter, referred to as an a-si:H) or the like.

The photosensors using such a thin film semiconductor are mainly classified into two kinds the photodiode type and the photoconductive type.

In the case of the photodiode type, since a reverse bias voltage is applied between, the electrodes, the electron-hole pairs generated by the light respectively reach both electrodes and a current merely flows in the opposite direction, and thereafter no carriers are implanted from the electrodes.

On the other hand, in the case of the photoconductive type, since electrons or holes can be implanted from the electrodes, the density of electrons or holes in the semiconductor sufficiently increases. By applying a voltage between the electrodes, a fairly large output current can be obtained as compared with the photodiode type.

Figure 1:
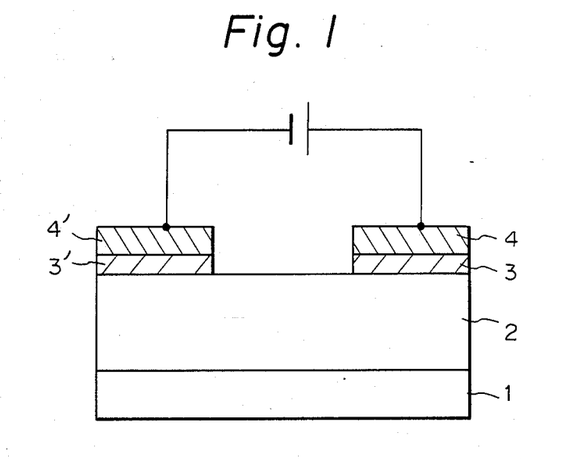
FIG. 1 is a schematic constitutional diagram of a photoconductive type sensor of a related background art.

FIG. 1 is a schematic constitutional diagram of a conventional photoconductive type sensor.

In the diagram, a semiconductor layer 2 such as CdS.Se, a-Si:H or the like is formed as a photoconductive layer on an insulative substrate 1 made of glass, ceramics, or the like. Further, a pair of electrodes 4 and 4' are formed over the semiconductor layer 2 through doping semiconductor layers 3 and 3' for ohmic-contact. If the carriers which are implanted from the electrodes into the semicondutor layer 2 are electrons, the doping semiconductor layers 3 and 3' are of the n type, and if the carriers are holes, the doping semiconductor layers 3 and 3' are of the P type.

In such a constitution, when light enters from the side of the substrate 1 (in the case of the transparent substrate 1) or from the sides of the electrodes 4 and 4', the density of electrons or holes which will contribute to conduction rises in the semiconductor layer 2 between the electrodes 4 and 4' by the light excitation. Therefore, as shown in the diagram, by applying a voltage between the electrodes 4 and 4', a large signal current flows by the light incidence. Thus, a large output can be obtained from both ends of a load resistance (not shown).

Since a large output signal is derived as mentioned above, a load of a signal reading circuit of the photoconductive type sensor is lightened and the equal magnification type line sensor or the like using the photoconductive type sensor can be constituted as a sensor having high sensitivity and a low cost.

However, since the response speed of the foregoing conventional photoconductive type sensor to the light is insufficient, there is a problem such that, for example, in the case of constituting the equal magnification type line sensor having a number of pixel sensors, the original cannot be read at a high speed.

SUMMARY OF THE INVENTION

It is an object of the present invention to provide a photoconductive type sensor having a good light response speed.

To accomplish this object, a photoconductive type sensor according to the invention comprises: a pair of main electrodes for allowing the carriers to be implanted which are arranged over a photoconductive layer through the portion serving as the photosensing region; and a gate electrode for giving a bias to the portion serving as the photo sensing region.

It is another object of the invention to provide a method of driving a photoconductive type sensor whereby a good light response speed is realized.

To accomplish this object, as the illuminance of incident light is large, the absolute value of the voltage which is applied to the gate electrode is reduced.

Still another object of the invention is to provide an apparatus for driving a photoconductive type sensor having a good light response speed.

To accomplish this object, a driving apparatus according to the invention comprises: photosensing means which is disposed at the position where the incident light in the photosensing region can be substantially sensed and which detects the illuminance of incident light; and voltage adjusting means for adjusting the voltage which is applied to the gate electrode on the basis of the output of the photosensing means.

BRIEF DESCRIPTION OF THE DRAWINGS

FIG. 7 shows the first embodiment of a photoconductive type sensor and its driving apparatus according to the invention, in which (A) shows a plan view; (B) shows a cross sectional view taken along the line A—A in the diagram (A), and (C) shows a cross sectional view taken along the line B—B in the diagram (A);

DETAILED DESCRIPTION OF THE PREFERRED EMBODIMENTS

A practical example of the operation of a gate electrode according to the present invention will be first described with reference to the drawings.

Figure 2:
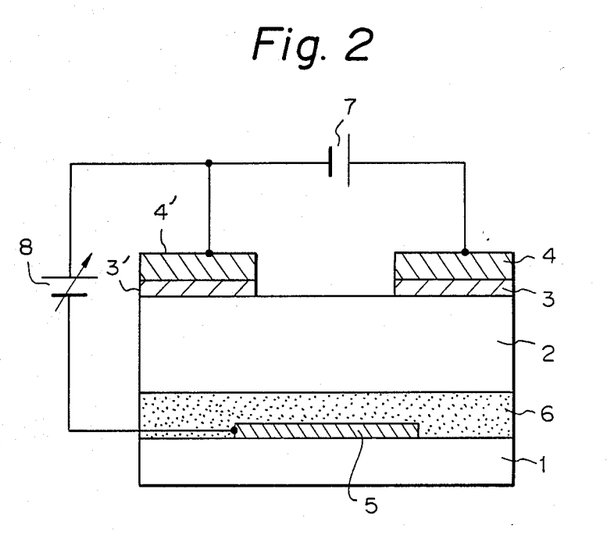
FIG. 2 is a fundamental constitutional diagram for schematically explaining a photoconductive type sensor and its driving method according to an embodiment of the invention.

FIG. 2 is a fundamental constitutional diagram for schematically explaining a photoconductivity type sensor and its driving method according to the embodiment of the invention.

In the diagram, a transparent or opaque conductive layer is patterned and a gate electrode 5 is formed on the transparent or opaque insulative substrate 1. Further, an insulative layer 6 such as $SiO_x$, $SiN_x$ or the like is formed on the insulative substrate 1 and gate electrode 5 by a sputtering method, glow discharge method, or the like. The semiconductor layer 2 such as CdS.Se, A-Si:H, or the like serving as a photoconductive layer, the doping semiconductor layers 3 and 3', and the electrodes 4 and 4' (in this case, the drain electrode 4 and the source electrode 4') are respectively formed on and over the insulative layer 6 as previously mentioned. In this embodiment, the doping semiconductor layers 3 and 3' are of the n type and the electrons are implanted as carriers.

In the photoconductive type sensor of the foregoing constitution, as shown in the diagram, a DC power source 7 is connected between the electrodes 4 and 4' and a variable DC power source 8 is connected between the source electrode 4' and the gate electrode 5, respectively. It is assumed that the polarity of the variable DC power source 8 can be also reversed.

Next, a change in current flowing between the electrodes 4 and 4' when the potential of the gate electrode 5 is changed will now be described with reference to FIG. 3.

Figure 3A:
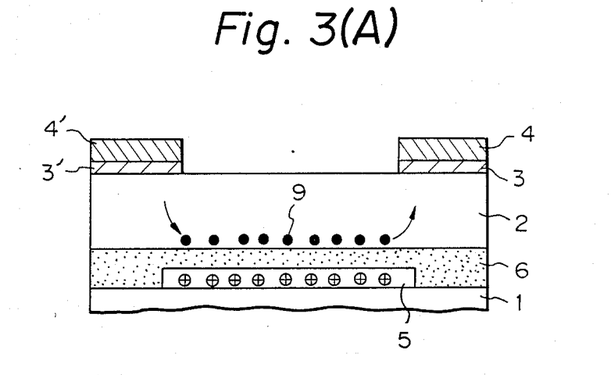
FIGS. 3A to 3C are schematic diagrams showing the states of electrons in a semiconductor layer 2 in the cases where the potential of a gate electrode 5 is positive to one source electrode 4', where it is the same potential as that of the source electrode 4', and where it is negative to the source electrode 4', respectively.
Figure 3B:
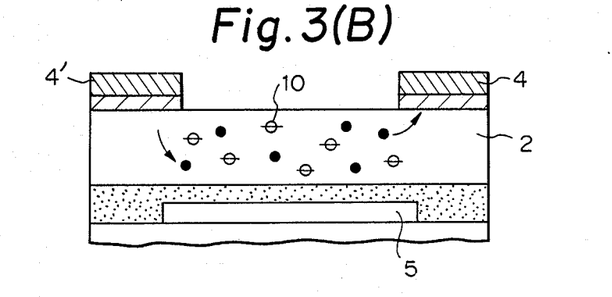
Figure 3C:
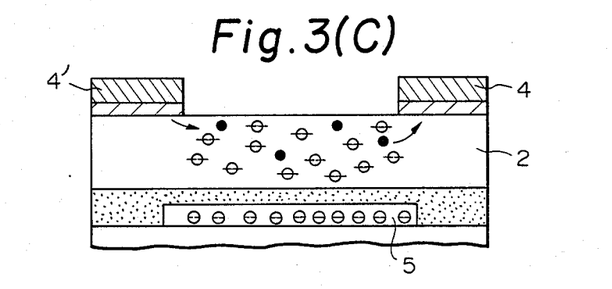

FIGS. 3A to 3C are diagrammatical views showing the states of the electrons in the semiconductor layer 2 in the cases where the potential of the gate electrode 5 is positive to the source electrode 4', where it is the same potential as that of the source electrode 4', and where it is negative to the source electrode 4', respectively. The trapped electrons are not shown for convenience of explanation.

First, when the potential of the gate electrode 5 is set to be positive to the electrode 4' as shown in FIG. 3A, electrons 9 are accumulated in the boundary in the semiconductor layer 2 at the boundary with the insulative layer 6 in accordance with the capacitance of the gate electrode 5, so that a channel is formed. A large current flows between the electrodes 4 and 4' through this channel. This state corresponds to the ON state of the field effect transistor. Since a large current flows irrespective of the presence or absence of the incident light, this sensor cannot be used as the photosensor.

Next, when the potential of the gate electrode 5 is reduced to be equal to the potential of the electrode 4', as shown in FIG. 3B, trapped holes 10 increase and the number of electrons 9 decreases. Thus, the current flowing between the electrodes 4 and 4' is reduced to a value lower than the case where the gate electrode 5 has the positive potential.

Further, when the gate electrode 5 is set to the negative potential, as shown in FIG. 3C, the holes as much as the capacitance of the gate electrode 5 are trapped and a large amount of holes are also trapped at the recombination level. Thus, the recombination life of electrons is reduced and the number of electrons in the semiconductor layer 2 decreases, so that the current is difficult to flow between the electrodes 4 and 4'.

However, when the light enters in this state, as mentioned above, the electrons in accordance with the illuminance of light are excited to the conduction band, so that the current flows between the electrodes 4 and 4'. Namely, since current according to the illuminance of the incident light flows, this sensor can be used as the photosensor. Such a gate voltage dependency of the current flowing between the electrodes 4 and 4' will be practically explained with reference to FIG. 4.

Figure 4:
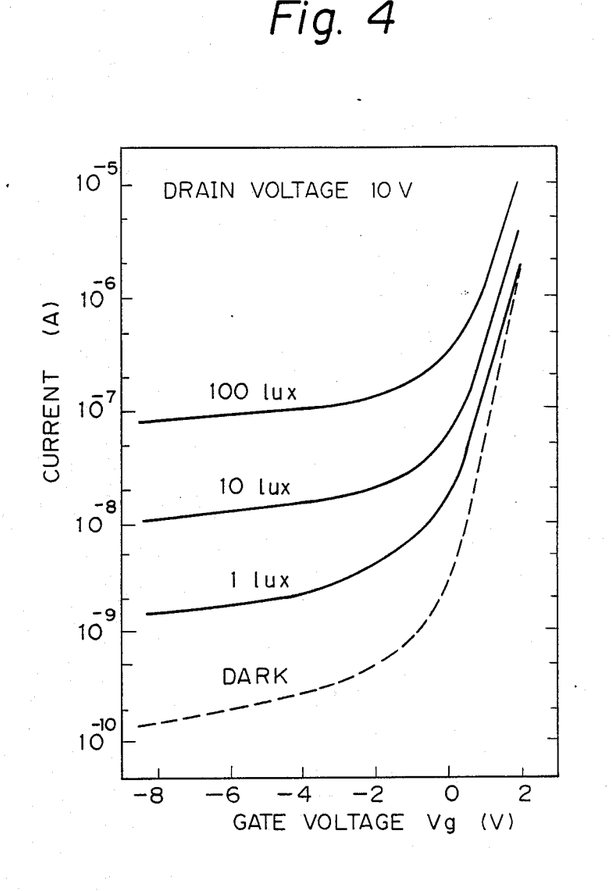
FIG. 4 is a graph showing the relation between the gate voltage and the source-drain current in which the illuminance is used as the parameter.

FIG. 4 is a graph showing the relation between the gate voltage and the source-drain current in which the illuminance is used as the parameter. The size of each side of the sensor shown in FIG. 2 is 100 μm and the voltage which is applied to the drain electrode 4 by the power source 7 is 10V.

As will be obvious from the graph of FIG. 4, when the gate voltage is positive, a large current flows substantially irrespective of the illuminance and there is no significant difference in the change in current value.

However, for example, when the gate voltage $V_g$ is −5V, the current value is about ⅓ of that in the case where $V_g$=0V. However, the dependency on the illuminance of the incident light is large and the sensor can be used as the photosensor having good characteristics. Also, even when the gate voltage $V_g$ is −5V, the current value is about 100 times as large as that in the case of a photodiode type sensor of the same size.

A change in photocurrent $I_p$ when the gate voltage $V_g$ varies will now be described.

Figure 5:
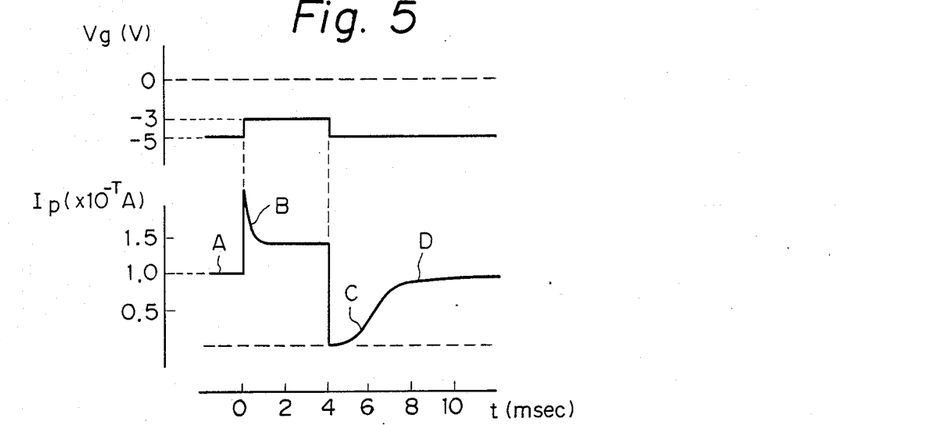
FIG. 5 is a waveform diagram showing changes in a pulse-like gate voltage $V_g$ and a photocurrent $I_p$ when the gate voltage $V_g$ was applied.

FIG. 5 is a waveform diagram showing changes in pulse-like gate voltage $V_g$ and a photocurrent $I_p$ when the gate voltage $V_g$ was applied. FIGS. 6A to 6D are energy band diagrams in the direction of thickness of the semiconductor layer 2 in the change processes A to D of the photo current $I_p$, respectively. However, the drain voltage is 10V and the illuminance of incident light is 100 luxes and these values are constant.

Figures 6A, 6B:
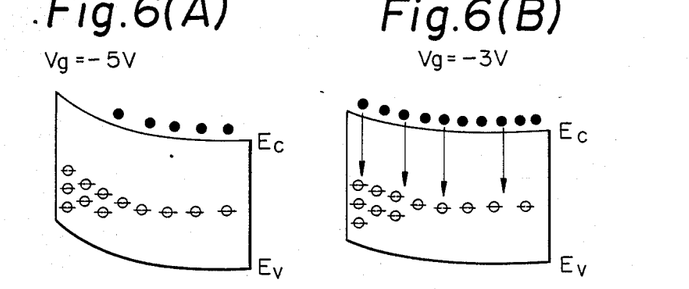
FIGS. 6A to 6D are diagrams showing energy bands in the direction of thickness of the semiconductor layer 2 in the change processes A to D of the photocurrent $I_p$, respectively.

First, when the gate voltage $V_g$ has the constant value of $-5V$, the photocurrent $I_p$ is in the stationary state A. As shown in FIG. 6A, the holes as much as the charge amount which is determined by the product of the capacitance of the gate electrode 5 and the applied voltage are trapped to the localized level.

Next, when the gate voltage $V_g$ rises to $-3V$ at $t=0$, the necessary positive charge amount decreases. Therefore, the electrons of the charge amount which is equal to the surplus charge amount are implanted from the source electrode 4' into the semiconductor layer 2 and the photocurrent $I_p$ rapidly rises as shown at state B. The implanted electrons are immediately trapped to the localized level as shown in FIG. 6B, so that the photocurrent $I_p$ is reduced and settles to a constant value.

Figure 6C:
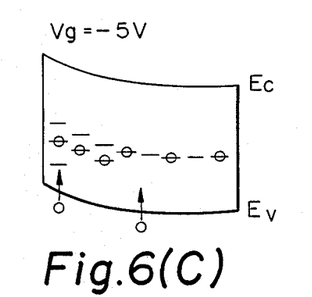

Next, when the gate voltage $V_g$ decreases to $-5V$ at $t=4$ msec, the positive charge amount is lacking. However, since no hole is implanted from the electrode, as shown in FIG. 6C, the electrons in the semiconductor layer 2 are contrarily swept from the electrode and the source-drain current temporarily remarkably decreases (state C in FIG. 5).

Figure 6D:
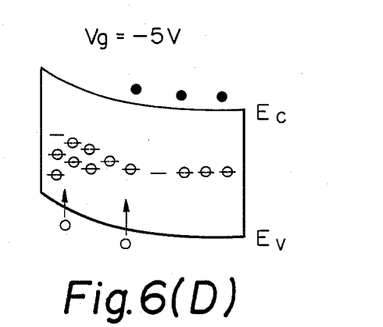

Thereafter, as shown in FIG. 6D, as the holes generated by the light irradiation are trapped to the localized level, the electrons also gradually increase and the photocurrent $I_p$ is gradually returned to the current value in the stationary state as shown in state D.

As explained above, when the gate voltage is changed, the source-drain current varies so as to emphasize the change direction. By use of this phenomenon, the photoconductive type sensor of good response speed to light can be obtained as will be practically explained hereinafter. An example of a practical constitution of the photoconductive type sensor according to the embodiment of the invention will now be described in detail hereinbelow with reference to the drawings.

Figure 7A:
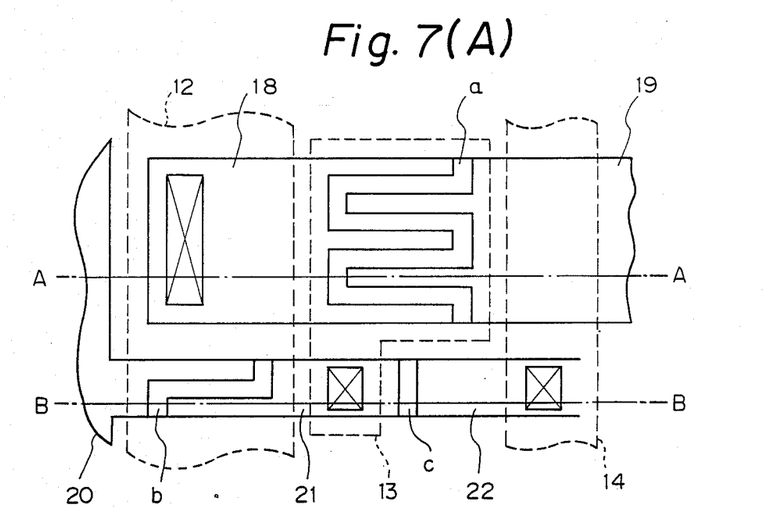
Figure 7B:
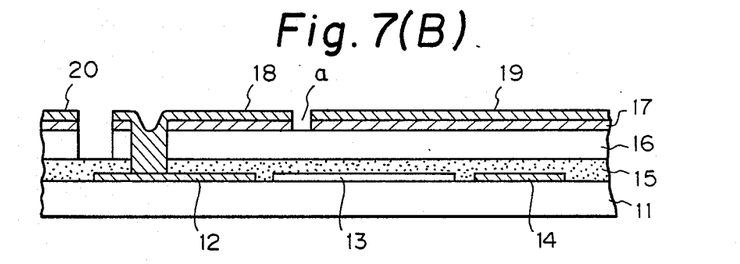
Figure 7C:
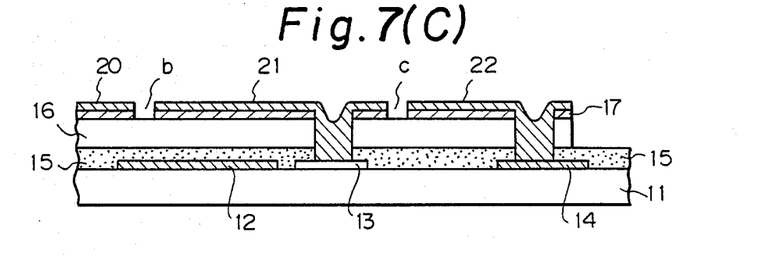

FIG. 7 shows the first embodiment of the photoconductive type sensor and its driving apparatus according to the invention, in which FIG. 7A is a plan view, FIG. 7B is a cross sectional view taken along the line A—A in FIG. 7A, and FIG. 7C is a cross sectional view taken along the line B—B in FIG. 7A.

In the diagrams, a power source line 12 which is applied with the voltage of $+10V$, a transparent gate electrode 13 made of $SnO_2$, and a grounding line 14 are patterned and formed on a glass substrate 11, respectively. A silicon nitride ($SiN_x$:H) film 15 is further formed on and over the respective components 11 to 14 by a glow discharge separation method (hereinafter, referred to as a GD method) using mono-silane ($SiH_4$) and ammonia ($NH_3$) as fundamental gases. Further, an amorphous silicon (a-Si:H) film 16 is formed as a photoconductive layer by the GD method using $SiH_4$ as the fundamental gas.

A thin $n^+$ a-Si:H film 17 is formed as a film for ohmic-contact on the a-Si:H film 16 by the GD method using $SiH_4$ as the fundamental gas in which phosphine ($PH_3$) was mixed so as to have the same pattern as that of each electrode.

Further, comb-shaped drain electrode 18 and a source electrode 19 are formed so as to have a gap a of width of $\mu$m. A gate power source line 20 and a floating potential electrode 21 connected to the gate electrode 13 are formed so as to have a gap b of width 10 $\mu$m. The floating potential electrode 21 and a grounding electrode 22 connected to the grounding line 14 are formed so as to have a gap c of width 10 $\mu$m. The $n^+$ a-Si:H film 17 of each of the gap portions is removed by an etching process.

Figure 8:
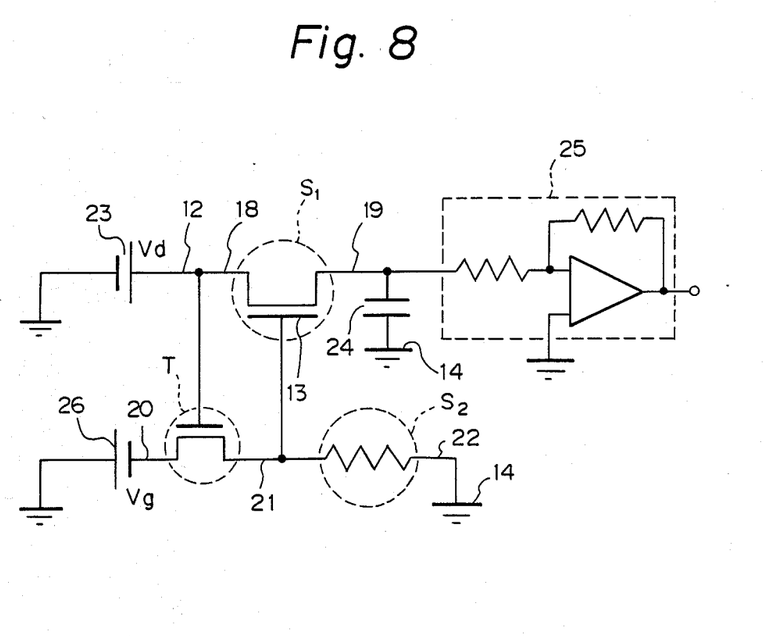
FIG. 8 is an equivalent circuit of the embodiment shown in FIG. 7.

FIG. 8 is an equivalent circuit diagram of this embodiment shown in FIG. 7.

In FIG. 8, a main sensor $S_1$ serving as the photoconductive type sensor comprises the gate electrode 13, silicon nitride film 15, a-Si:H film 16 of the gap portion a; drain electrode 18, and source electrode 19. A positive voltage $V_d$ is applied from a power source 23 to the drain electrode 18 through the power source line 12. The source electrode 19 together with the grounding line 14 constitutes a capacitor 24 to accumulate the photocurrent and is further connected to an amplifier 25 for amplification.

A sub sensor $S_2$ as photosensing means for detecting the illuminance of the incident light comprises the a-Si:H film 16 of the gap portion c, floating potential electrode 21, and grounding electrode 22. The conductance of the sub sensor $S_2$ varies in dependence on the light $h\nu$ which enters from the side of the glass substrate 11.

A transistor T comprises the gate power source line 20, floating potential electrode 21, a-Si:H film 16 of the gap portion b, and power source line 12. However, in this embodiment, since the power source line 12 applied with the positive voltage $V_d$ is the gate of the transistor T, the resistance value of the transistor T is low when it is ON.

A negative voltage $V_g$ is applied from a power source 26 to the gate power source line 20. The line 20 is connected to the floating potential electrode 21 through the transistor T of a low resistance value. The electrode 21 is grounded by the sub sensor $S_2$ whose conductance varies depending on the light $h\nu$. Therefore, the potential of the floating potential electrode 21, i.e., the potential of the gate electrode 13 of the main sensor $S_1$ is set to a negative potential and varies in accordance with the illuminance of the light which enters the sub sensor $S_2$. Namely, assuming that the conductance of sub sensor $S_2$ is $G_1$ and the conductance of transistor T is $G_2$, the potential $v_g$ of the gate electrode 13 is expressed by the following expression.

$$v_g = \frac{G_2}{G_1 + G_2} \cdot V_g$$

The operation of the embodiment having the foregoing constitution will now be described.

FIGS. 9A to 9D are waveform diagrams of an optical pulse, a photocurrent of the sub sensor $S_2$, a potential of the gate electrode 13, and a photo current of the main sensor $S_1$ for explaining the operation of the embodiment, respectively. FIG. 9E is a waveform diagram of a photocurrent of a conventional photosensor.

Figure 9A:
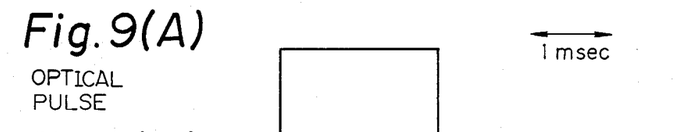
FIGS. 9A to 9D are waveform diagrams of an optical pulse, a photo current of a sub sensor $S_2$, a potential of a gate electrode 13, and a photo current of a main sensor $S_1$ for explaining the operations of the embodiment, respectively.
Figure 9B:
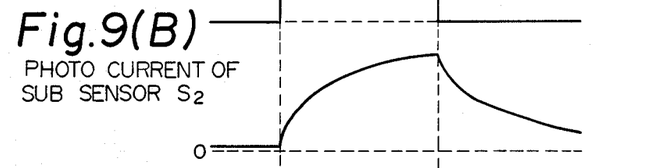
Figure 9C:
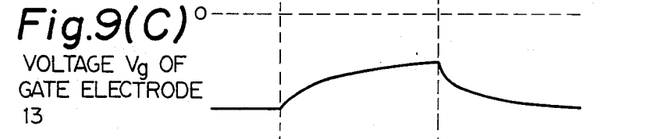

First, when the optical pulse $h\nu$ as shown in FIG. 9A is irradiated to the main sensor $S_1$ and sub sensor $S_2$, the photocurrent as shown in FIG. 9B flows from the grounding line 14 through the sub sensor $S_2$ to the side of the gate power source line 20. Thus, the potential $v_g$ of the floating potential electrode 21 and gate electrode 13 increases from a predetermined negative potential as shown in FIG. 9C. Namely, the potential $v_g$ of the gate electrode 13 is almost equal to the negative potential $V_g$ of the power source 26 since $G_1 < < G_2$ before the light enters. However, when the light enters, the value of $G_1$ increases, so that the potential $v_g$ of the gate electrode 13 starts rising from the negative potential $V_g$. When the optical pulse $h\nu$ trails, $G_1$ decreases, so that the potential $v_g$ of the gate electrode 13 is returned to the negative potential $V_g$.

Figure 9D:
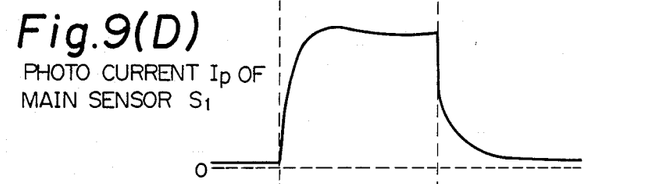
Figure 9E:
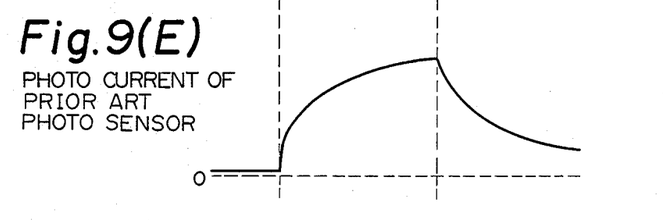
FIG. 9E is a waveform diagram of a photo current of a photo sensor of a related background art.

When the potential of the gate electrode 13 rises from the negative potential $V_g$ or is returned to the negative potential $V_g$, the source-drain current of the main sensor $S_1$ varies so as to emphasize the change direction as previously explained in FIG. 5. Therefore, the photo current $I_p$ of the main sensor $S_1$ promptly rises and trails in correspondence to the optical pulse $h\nu$ as shown in FIG. 9D.

As an example for comparison, FIG. 9E shows the leading and trailing edges of the photocurrent in a conventional photosensor. When FIGS. 9D and 9E are compared, it will be appreciated that the response speed to the light of the photosensor of the embodiment is fairly better than that of the conventional one.

When the photocurrent $I_p$ corresponding to the incident light flows through the main sensor $S_1$ in this manner, the charges are accumulated into the capacitor 24 for accumulation of the photocurrent. The voltage corresponding to the accumulated charge amount is amplified by the amplifier 25 and output as the light information.

An example of a constitution of the line sensor consisting of an array of the above-described embodiment will now be explained.

Figure 10:
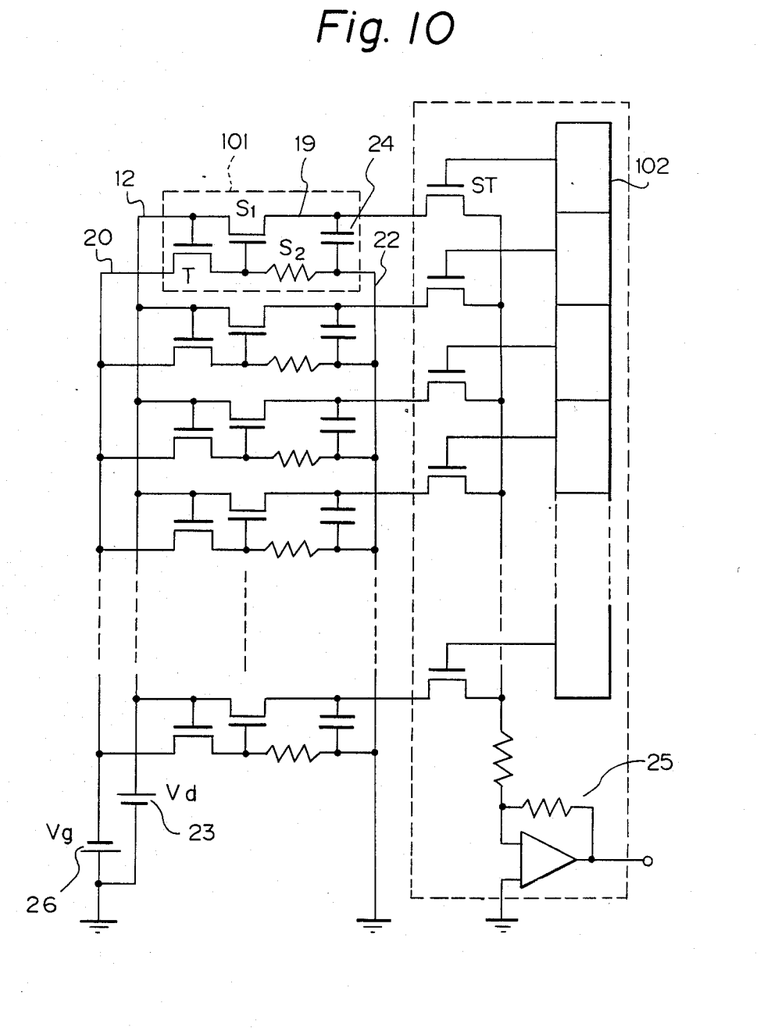
FIG. 10 is a circuit diagram showing an example of a constitution of a line sensor using the embodiment.

FIG. 10 is a circuit diagram showing an example of a constitution of a line sensor using the embodiment.

In the diagram, a cell 101 corresponds to the embodiment shown in FIG. 7. These cells 101 are arranged in a line. The positive voltage $V_d$ of the power source 23 is applied to the power source line 12 of each cell 101. The negative voltage $V_g$ of the power source 26 is applied to the gate power source line 20. The grounding electrode 22 of each cell 101 is grounded and each source electrode 19 together with the grounding line 22 constitutes the capacitor 24 and is also commonly connected to the amplifier 25 through each transistor ST. Each gate electrode of the transistors ST is connected to a parallel output terminal of a shift register 102. The transistors ST are sequentially turned on at the operation timing of the shift register 102.

In such a constitution, when the light enters each cell 101, charges of the amount corresponding to each incident illuminance are accumulated into the capacitor 24 and a voltage corresponding to the accumulated charge amount is generated. After the accumulation of the charges was performed for a fixed period of time, the shift register 102 is made operative, thereby sequentially turning on the transistors ST. The voltages of the capacitors 24 in the respective cells 101 are serially input to the amplifier 25 and output as the light information.

Figure 11A:
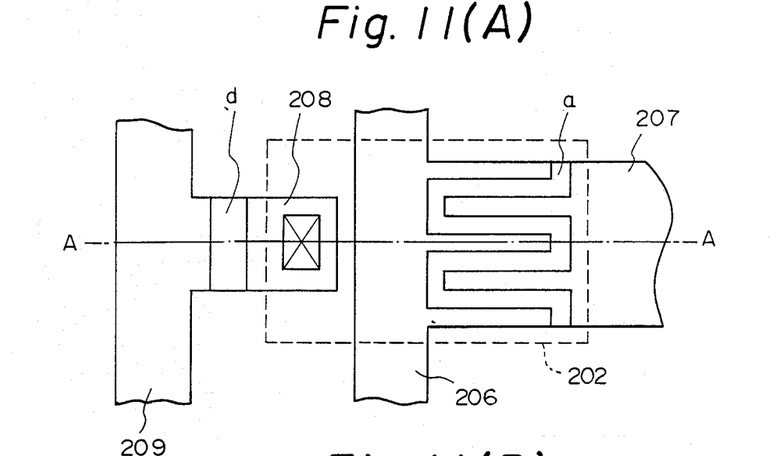
FIG. 11A is a plan view of the second embodiment of the invention.
Figure 11B:
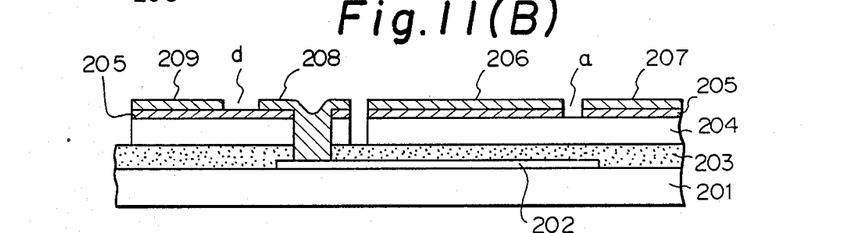
FIG. 11B is a cross sectional view taken along the line A—A in FIG. 11A.

FIG. 11A is a plan view of the second embodiment of the invention and FIG. 11B is a cross sectional view taken along the line A—A in FIG. 11A.

In each diagram, a transparent gate electrode 202 made of $SnO_2$ is patterned and formed on a glass substrate 201. A silicon nitride ($SiN_x$:H) film 203 is formed on and over the glass substrate 201 and gate electrode 202 by the GD method using $SiH_4$ and $NH_3$ as the fundamental gases. The flow rate of $NH_3$ to $SiH_4$ is set to be 0.5 or less, so that the silicon nitride film 203 constitutes the film such that although it has a high resistance value, a small current can flow.

Further, an a-Si:H film 204 is formed as a photoconductive layer by the GD method using $SiH_4$ as the fundamental gas.

A thin n+ a-Si:H film 205 is formed as a film for ohmic-contact on the a-Si:H film 204 by the GD method using $SiH_4$ as the fundamental gas in which $PH_3$ is mixed so as to have the same pattern as each electrode.

Further, a comb-shaped drain electrode 206 and a source electrode 207 are formed so as to have a gap a of width 10 $\mu$m. A floating potential electrode 208 connected to the gate electrode 202 and a gate power source line 209 are formed so as to have a gap d of width 20 $\mu$m. The n+ a-Si:H film 205 of the gap portion a is removed by the etching process, thereby forming the photosensing section of the photoconductive type sensor. However, the n+ a-Si:H film 205 of the gap portion d is not etched. Therefore, the floating potential electrode 208 and gate power source line 209 are connected by way of a low resistor.

Figure 12:
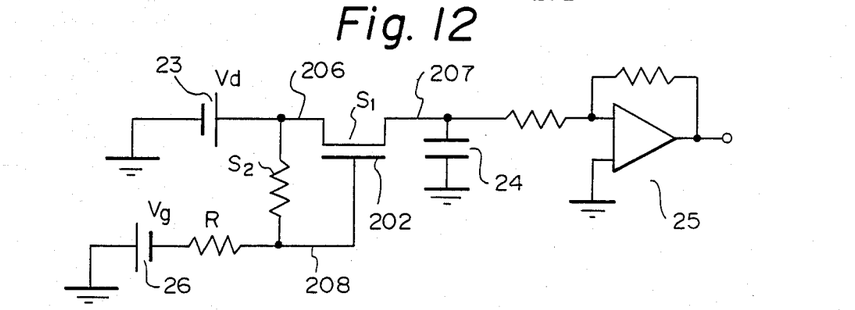
FIG. 12 is an equivalent circuit diagram of the embodiment shown in FIG. 11.

FIG. 12 is an equivalent circuit diagram of the embodiment shown in FIG. 11.

In FIG. 12, the main sensor $S_1$ comprises the gate electrode 202, silicon nitride film 203, a-Si:H film 204 of the gap portion a, drain electrode 206, and source electrode 207. The positive voltage $V_d$ is applied from the power source 23 to the drain electrode 206. The source electrode 207 together with a grounding line (not shown) constitutes the capacitor 24 to accumulate the photocurrent and is further connected to the amplifier 25 for amplification.

The sub sensor $S_2$ comprises the drain electrode 206, n+ a-Si:H film 205, a-Si:H film 204, silicon nitride film 203, and gate electrode 202. As mentioned above, since the silicon nitride film 203 has a high resistance such that a small current can flow, the conductance $G_1$ of the sub sensor $S_2$ varies by the light $h\nu$ which enters from the side of the glass substrate 201. Namely, the sub sensor $S_2$ has an extremely high resistance value in the dark state. However, when the light enters, conductivity is caused due to the photoconductivity of the silicon nitride film itself 203 and the implantation of carriers from the a-Si:H film 204.

A resistor R is the n+ a-Si:H film 205 of the gap portion d and the negative voltage $V_g$ is applied from the power source 26 to the gate electrode 202 through the floating potential electrode 208, resistor R, and gate power source line 209.

Therefore, the potential $v_g$ of the gate electrode 202 varies in dependence on the change in conductance $G_1$ of the sub sensor $S_2$. Namely, assuming that the conductance of resistor R is $G_2$, the potential $v_g$ of the gate electrode 202 is expressed as follows.

$$v_g = \frac{G_1 V_d + G_2 V_g}{G_1 + G_2}$$

Therefore, although the potential $v_g$ is almost equal to the negative voltage $V_g$ because $G_1 < < G_2$ in the dark state, when the conductance $G_1$ increases by the incident light, the potential $v_g$ rises. On the contrary, the potential $v_g$ is returned to the negative voltage $V_g$ in the dark state.

Since the potential $v_g$ of the gate electrode 202 changes as mentioned above, the response speed of the photocurrent of the main sensor $S_1$ can be improved similarly to the first embodiment.

In the embodiment, the current also flows between the source electrode 207 and gate electrodes 202. However, the overlap portion of both electrodes 207 and 202 is small and the difference between the potentials of those electrodes is smaller than that in the case of the drain electrode 206. Therefore, the leak current can be ignored.

It is apparent that the line sensor shown in FIG. 10 can be constituted by use of this embodiment.

In each of the foregoing embodiments, the potential of the gate electrode of the main sensor $S_1$ has been adjusted by use of the change in conductance of the sub sensor $S_2$ using the same photoconductive layer. However, the invention is not limited to this method but gate potential adjusting means may be also individually provided. For example, the invention is not limited to only the constitution in which the sub sensor $S_2$ is provided every cell as shown in FIG. 10. However, if the sub sensor $S_2$ can substantially monitor the illuminance of the incident light of each main sensor $S_1$, the average value or sample value or the like of the illuminances, the invention can be also constituted in a manner such that the sub sensors $S_2$ are individually provided and the gate potential is determined from the outputs of those sensors.

In addition, if the holes are implanted into the photoconductive layer from the source electrode or drain electrode, it s sufficient to constitute the invention in a manner such that the positive potential is applied to the gate electrode and as the illuminance of the incident light increases, the gate potential is reduced.

As described in detail above, according to the photoconductive type sensor of each of the embodiments, as the illuminance of the incident light is large, the absolute value of the voltage to be applied to the gate electrode is reduced, thereby enabling the response speed to light to be remarkably improved as compared with the conventional devices. Therefore, the sensor can operate at a high speed and even if the line sensor having a number of pixel sensors is constituted, the original can be read at a high speed.

On the other hand, a fairly larger signal current than that of the photodiode type sensor of the same size can be derived. Consequently, the load of the signal reading circuit is lightened and the cost can be reduced.

What is claimed is:

1. An apparatus for driving a photoconductive type sensor comprising:

an insulative layer;

a photoconductive layer;

a gate electrode;

a pair of main electrodes for allowing carriers to be implanted in said photoconductive region to form a in a portion thereof a photosensing region, wherein said photoconductive layer and said gate electrode are laminated on said insulative layer in at least the photosensing region;

photosensing means for detecting an illuminance of incident light wherein said photosensing means is disposed at a position where light incident on said photosensing region can be substantially detected; and voltage adjusting means for adjusting a voltage which is applied to said gate electrode in response to an output of said photosensing means.

2. A driving apparatus according to claim 1, wherein said photosensing means uses a portion of said photoconductive layer other than said photosensing region.

3. A driving apparatus according to claim 1, wherein said voltage adjusting means reduces an absolute value of the voltage which is applied to said gate electrode when an illuminance of the incident light of said photosensing means is large.

* * * * *